United States Patent
Choi et al.

(10) Patent No.: US 10,090,367 B2
(45) Date of Patent: Oct. 2, 2018

(54) DISPLAY DEVICE

(71) Applicant: LG ELECTRONICS INC., Seoul (KR)

(72) Inventors: Moongoo Choi, Seoul (KR); Jinwoo Sung, Seoul (KR); Juchul Lee, Seoul (KR); Koun Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/539,506

(22) PCT Filed: Jan. 6, 2015

(86) PCT No.: PCT/KR2015/000084
§ 371 (c)(1),
(2) Date: Jun. 23, 2017

(87) PCT Pub. No.: WO2016/104856
PCT Pub. Date: Jun. 30, 2016

(65) Prior Publication Data
US 2017/0352714 A1    Dec. 7, 2017

(30) Foreign Application Priority Data
Dec. 24, 2014  (KR) .................. 10-2014-0187742

(51) Int. Cl.
*H01L 51/52*    (2006.01)
*H01L 27/32*    (2006.01)

(52) U.S. Cl.
CPC ........ *H01L 27/3251* (2013.01); *H01L 27/322* (2013.01); *H01L 27/3211* (2013.01); *H01L 27/3248* (2013.01); *H01L 27/3202* (2013.01)

(58) Field of Classification Search
CPC ............... H01L 27/3251; H01L 27/322; H01L 27/3248; H01L 27/3211; H01L 27/3202
See application file for complete search history.

(56) References Cited

U.S. PATENT DOCUMENTS

| | | | |
|---|---|---|---|
| 2007/0200492 A1 | 8/2007 | Cok et al. | |
| 2010/0283036 A1* | 11/2010 | Coe-Sullivan | H01L 51/5268 257/13 |
| 2012/0119239 A1 | 5/2012 | Kim et al. | |
| 2012/0326180 A1* | 12/2012 | Ohe | H01L 27/322 257/88 |
| 2013/0146903 A1 | 6/2013 | Ichikawa et al. | |

(Continued)

FOREIGN PATENT DOCUMENTS

| CN | 103474451 A | 12/2013 |
|---|---|---|
| CN | 104112766 A | 10/2014 |

(Continued)

*Primary Examiner* — Donald Raleigh
(74) *Attorney, Agent, or Firm* — Birch, Stewart, Kolasch & Birch, LLP

(57) ABSTRACT

A display device includes at least one light-emitting element configured to emit blue light, a red conversion layer disposed on an upper or lower portion of the at least one light-emitting element and including a red light-emitting quantum dot, a green conversion layer disposed on the upper or lower portion of the at least one light-emitting element and including a green light-emitting phosphor, and a substrate comprising thin film transistors electrically connected to the light-emitting element.

17 Claims, 4 Drawing Sheets

(56) References Cited

U.S. PATENT DOCUMENTS

2015/0228697 A1    8/2015   Liu et al.
2016/0027848 A1    1/2016   Liu et al.

FOREIGN PATENT DOCUMENTS

| KR | 10-2008-0085330 A | 9/2008 |
| KR | 10-2009-0024191 A | 3/2009 |
| KR | 10-2010-0138442 A | 12/2010 |
| KR | 10-2011-0109289 A | 10/2011 |
| KR | 10-2014-0070145 A | 6/2014 |

\* cited by examiner

[Figure 1]
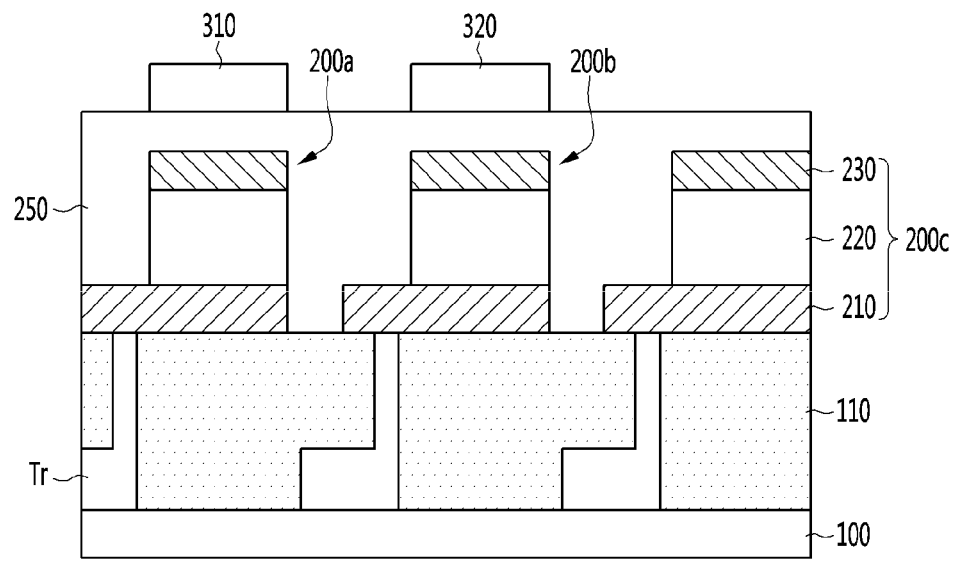
[Figure 2]
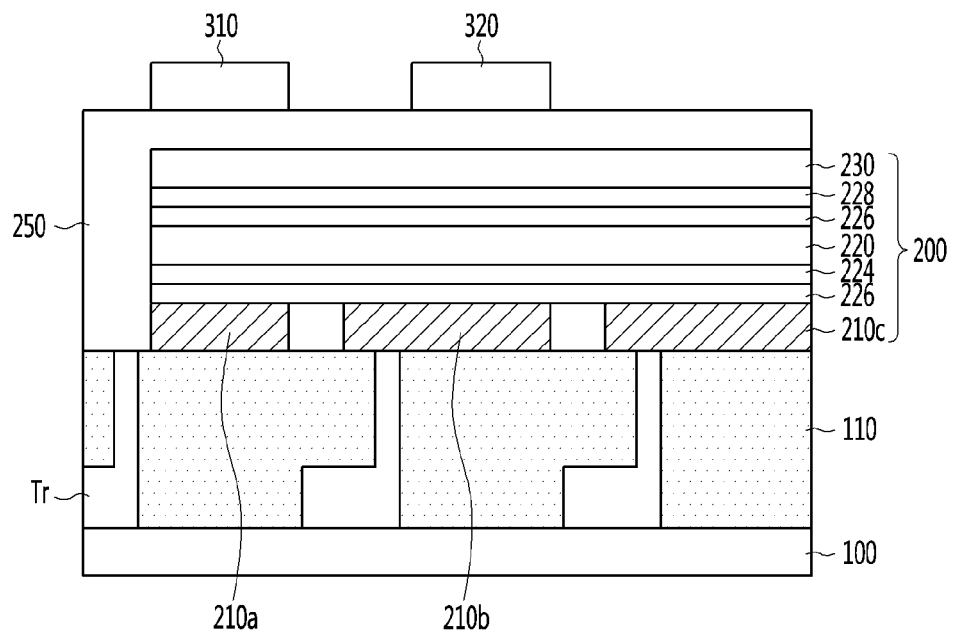

[Figure 3]
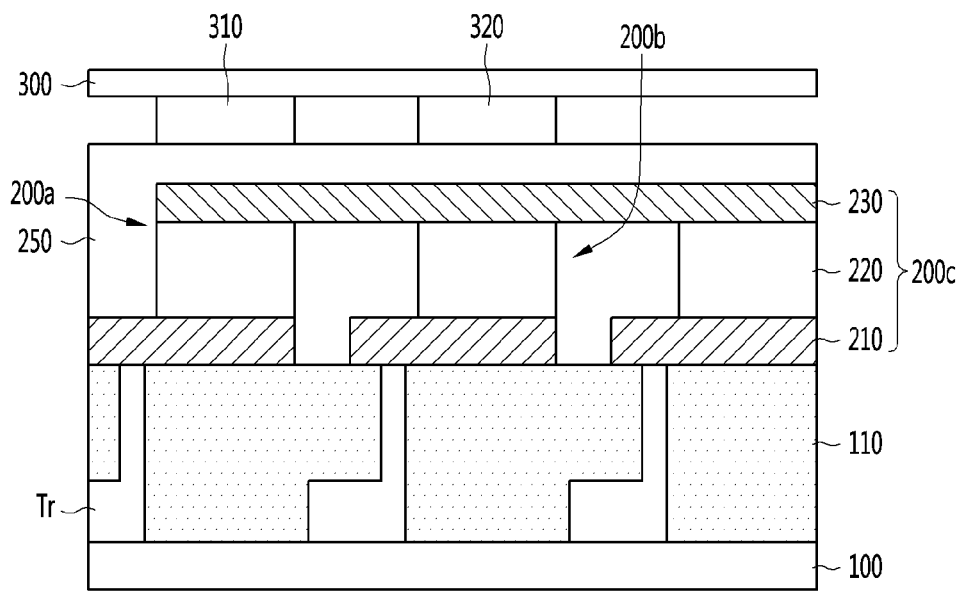
[Figure 4]
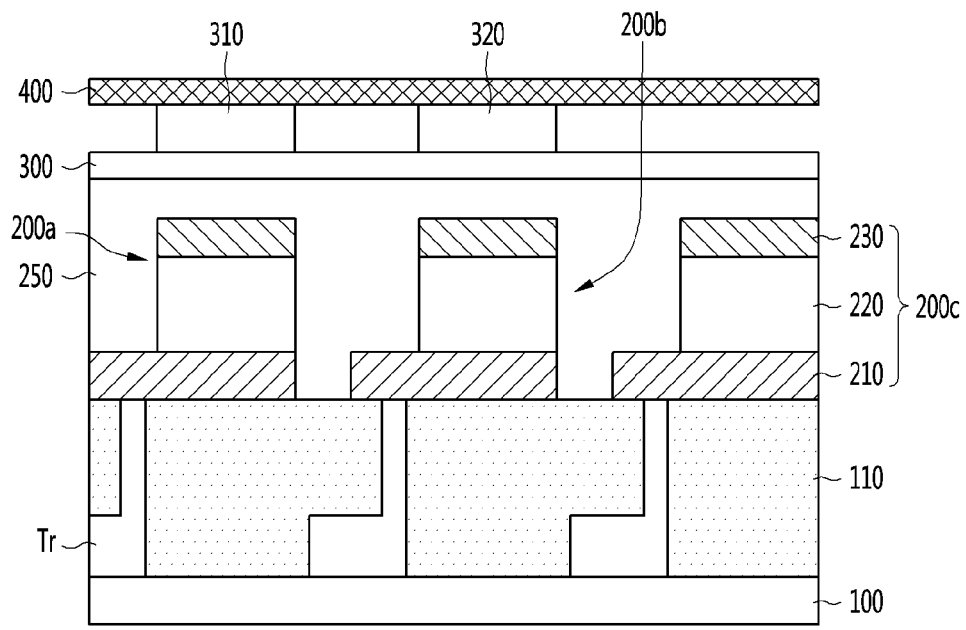

[Figure 5]
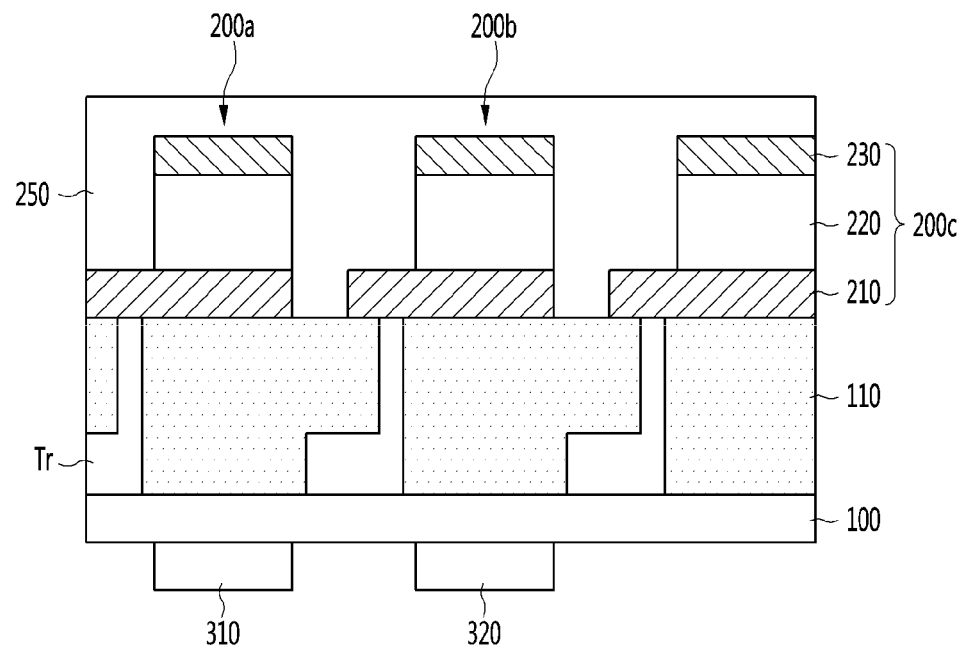
[Figure 6]
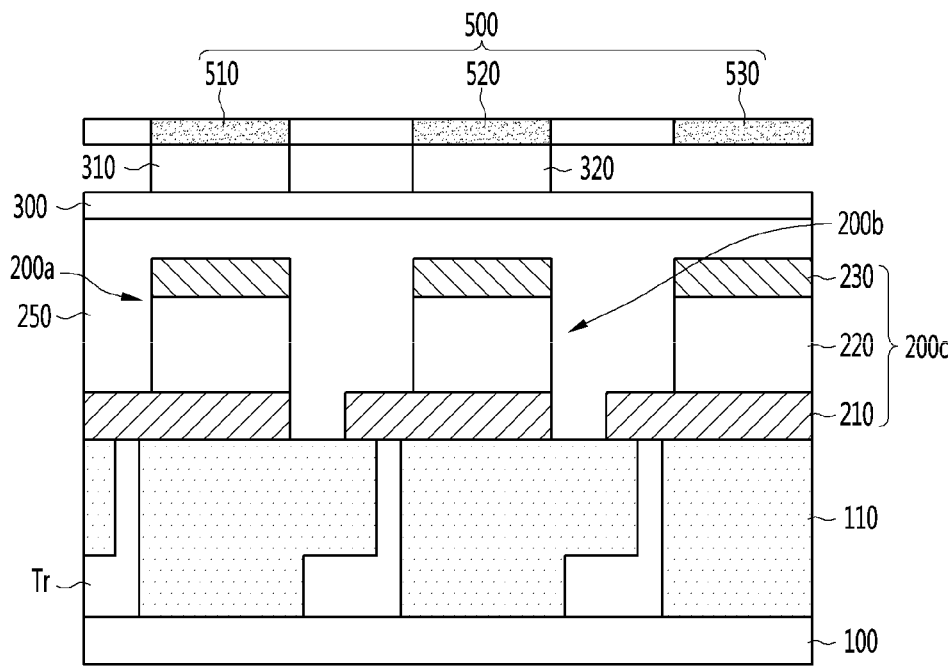

[Figure 7]
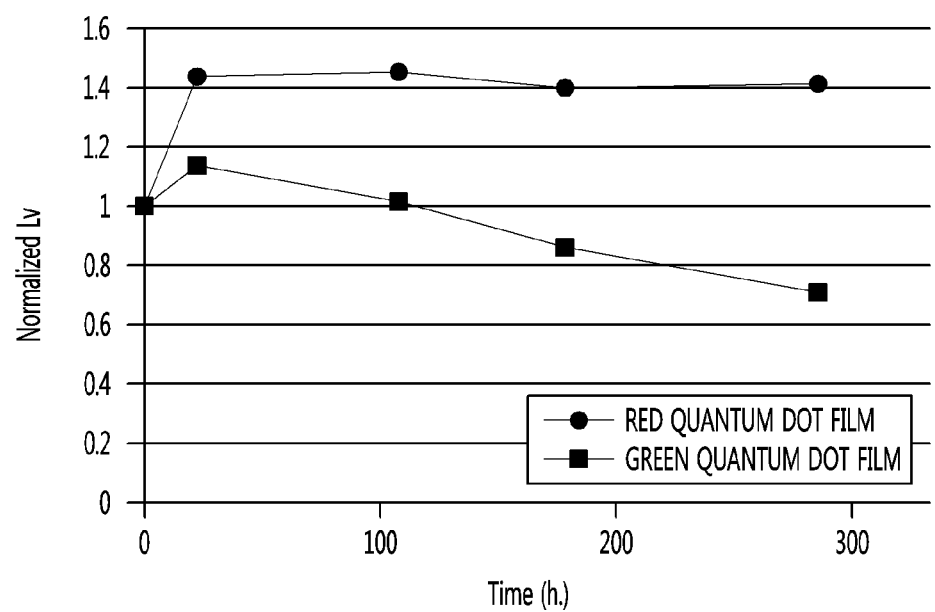

DISPLAY DEVICE

CROSS REFERENCE TO RELATED APPLICATIONS

This application is the National Phase of PCT International Application No. PCT/KR2015/000084, filed on Jan. 6, 2015, which claims priority under 35 U.S.C. 119(a) to Korean Patent Application No. 10-2014-0187742, filed in the Republic of Korea on Dec. 24, 2014, all of which are hereby expressly incorporated by reference into the present application.

BACKGROUND OF THE INVENTION

Field

The present invention relates to a display device, and more particularly, to a display device that has a simple manufacturing process, high light utilization efficiency, and excellent color reproducibility and stability.

Background Art

In recent years, with a fully fledged information age, display fields for visually expressing electrical information signals have rapidly developed. In response to this repaid development of the display fields, various flat display devices having superior performance such as thinning, lightening, and low power consumption have been developed and are rapidly replacing existing cathode ray tubes (CRTs).

Exemplary examples of the flat display devices include liquid crystal display devices (LCDs), organic light-emitting display devices (OLEDs), electrophoretic display devices (EPDs), electric paper display devices, plasma display panel devices (PDPs), field emission display devices (FEDs), electro luminescence display devices (ELDs), and electro-wetting display devices (EWDs). Each of the abovementioned display devices includes a flat panel display in common as an essential component. The flat panel display includes a pair of substrates bonded to each other with a proper luminescent material or a polarizing material layer therebetween.

An OLED, which is one of the flat panel displays, is a self-emissive device that can be lightweight and thin because a separate light source used in a liquid crystal display device that is a non-emissive device is not required. Also, since the OLED has a superior viewing angle and contrast ratio, is advantageous in terms of power consumption, can be driven at a low DC voltage, has a fast response speed, and includes internal solid components when compared to the liquid crystal display device, it is resistant to an external impact and has a wide temperature range.

Meanwhile, the OLED is classified into an RGB OLED and a white OLED according to a color implementing method.

The RGB OLED implements colors by using light-emitting diodes that respectively emit red light, green light, and blue light. Since the RGB OLED directly uses light electrophotically converted in each of the light-emitting diodes, the RGB OLED has high utilization efficiency. However, the RGB OLED has limitations in that material development, structural design, and the like must be performed with respect to each of R, G, and B light-emitting diodes and a pattern forming process is complex. In addition, since the R, G, and B light-emitting diodes have different lifespans, an issue of implementing a color may occur when the RGB OLED is used for a long time.

Meanwhile, the white OLED implements colors by disposing red, green, and blue color filters on a white light-emitting diode and converting white light into red light, green light, and blue light. Since the white OLED uses a single light-emitting diode, the manufacturing thereof is simple. However, since light having the remaining wavelength ranges is not used except for necessary color light of the white light emitted from the white light-emitting diode, a finally extracted amount is small for consumed power.

SUMMARY

Embodiment provides a display device using a light-emitting element having a simple manufacturing process and superior light utilization efficiency.

In one embodiment, a display device includes: at least one light-emitting element configured to emit blue light; a red conversion layer disposed on an upper or lower portion of the at least one light-emitting element and including a red light-emitting quantum dot; a green conversion layer disposed on the upper or lower portion of the at least one light-emitting element and including a green light-emitting phosphor; and a substrate including thin film transistors electrically connected to the light-emitting element.

Since the display device according to the present invention uses only a blue light-emitting element, it may be unnecessary to individually deposit or design R, G, and B pixels, like in an RGB OLED, thereby simplifying a manufacturing process.

Also, since the display device according to the present invention converts light emitted from the blue light-emitting element to realize red light and green light, the light utilization efficiency may be improved as compared to white OLED that realizes red light, green light, and blue light by using white light.

Also, since the green conversion layer is formed by using the green light-emitting phosphor instead of a green light-emitting quantum dot that is sensitive to external environment, and the red conversion layer is formed by using the red light-emitting quantum dot having superior color reproducibility, the display device having both stability and color reproducibility of the product may be provided.

BRIEF DESCRIPTION OF THE DRAWINGS

FIG. 1 is a view for explaining a display device according to a first embodiment of the present invention.

FIG. 2 is a view for explaining a display device according to a second embodiment of the present invention.

FIG. 3 is a view for explaining a display device according to a third embodiment of the present invention.

FIG. 4 is a view for explaining a display device according to a fourth embodiment of the present invention.

FIG. 5 is a view for explaining a display device according to a fifth embodiment of the present invention.

FIG. 6 is a view for explaining a display device according to a sixth embodiment of the present invention.

FIG. 7 is a graph showing comparison between stability of a red light-emitting quantum dot and a green light-emitting quantum dot.

DETAILED DESCRIPTION OF THE EMBODIMENTS

Reference will now be made in detail to the embodiments of the present invention, examples of which are illustrated in the accompanying drawings.

Advantages and features of the present invention, and implementation methods thereof will be clarified through the following embodiments described with reference to the accompanying drawings. The present invention may, however, be embodied in different forms and should not be construed as limited to the embodiments set forth herein. Rather, these embodiments are provided so that this invention will be thorough and complete, and will fully convey the scope of the present invention to those skilled in the art. Further, the present invention is only defined by scopes of claims.

The shapes, sizes, ratios, angles, numbers, and the like illustrated in the accompanying drawings for describing the exemplary embodiments of the present invention are merely examples, and the present invention is not limited thereto. Like reference numerals denote like elements throughout the descriptions. Moreover, detailed descriptions related to well-known functions or configurations will be ruled out in order not to unnecessarily obscure subject matters of the present invention.

The terms such as "comprising", "including", and "having" used herein are generally intended to allow other components to be added unless these terms are used with the term "only". Any references to singular may include plural unless expressly stated otherwise.

Components are interpreted to include an ordinary error range even if not expressly stated.

When positional relation of two portions is explained by "on", "upper", "lower", "beside", etc., one or more components may be positioned between two portions unless "just" is not used. When portions are connected by "or", the portions are interpreted as including "alone" as well as "combination thereof" but when portions are connected by "or", "one of", portions are interpreted as "alone".

In describing the temporal relationship, such as "after", "subsequent", "next", "before", or the like, discontinuous cases also are included unless these terms are used with the term "immediately" or "directly".

Also, it will be understood that although the terms "first", "second", etc. may be used herein to describe various components, these components should not be limited by these terms. These terms are only used to distinguish one component from another. Therefore, a first component used herein may be a second component within the technical scope of the present invention.

Features of various embodiments of the present invention are partially or entirely coupled or combined with each other, and technically various interlocking and driving are enabled. Also, the embodiments may be independently performed with respect to each other, or performed in combination of each other.

FIGS. 1 to 6 illustrate display devices according to embodiments of the present invention. As shown in FIGS. 1 to 6, a display device includes one or more light-emitting elements 200, 200a, 200b, and 200c, a red conversion layer 310, a green conversion layer 320, and a substrate 100 including thin film transistors Tr electrically connected to the light-emitting elements 200, 200a, 200b, and 200c.

Each of the one or more light-emitting elements 200, 200a, 200b, and 200c is provided for forming a sub-pixel and includes a light-emitting element that emits blue light. Each of the light-emitting elements 200, 200a, 200b, and 200c includes a first electrode 210, an emission layer 220, and a second electrode 230.

The first electrode 210 is an anode electrode electrically connected to the thin film transistor Tr that will be described later, and may be made of a predetermined metal material such as Al or a transparent conductive material such as ITO.

The emission layer 220 includes a light-emitting material that emits blue light. If necessary, the emission layer 220 may further include a hole transport material or an electron transport material for improving injection and/or transport of holes and/or electrons.

As shown in FIG. 1, the light-emitting element 200 may include only the emission layer between the first electrode 210 and the second electrode 230. Also, as shown in FIG. 2, the light-emitting element 200 may further include functional layers for assisting the injection and transport of the holes or the electrons between the emission layer 220 and the first electrode 210 and/or between the emission layer 220 and the second electrode 230.

For example, one or more functional layers for improving hole injection and/or transport capability, for example, a hole injection layer 226 and a hole transport layer 224, may be provided between the emission layer 220 and the first electrode 210. Also, one or, more functional layers for improving electron injection and/or transport capability, for example, an electron transport layer 226 and an electron injection layer 228, may be further provided between the emission layer 220 and the second electrode 230. Although each of the hole injection layer, the hole transport layer, the electron injection layer, and the electron transport layer is provided as one layer in FIG. 2, the present invention is not limited thereto. That is, the hole injection layer and the hole transport layer may be combined with each other to form one layer, or each of the hole injection layer and the hole transport layer may be provided as a multi-layered structure including two or more layers. Also, the electron injection layer and the electron transport layer may be combined with each other to form one layer, or each of the electron injection layer and the electron transport layer may be provided as a multi-layered structure including two or more layers.

Next, the second electrode 230 is a cathode electrode disposed above the emission layer 220 and may be made of a metal material or a transparent conductive material such as ITO. When two or more light-emitting elements are provided, the second electrode 230 may be provided for each light-emitting element as shown in FIG. 1. Alternatively, as shown in FIG. 3, the second electrodes of the light-emitting devices may be connected to each other.

Also, the one or more light-emitting elements 200, 200a, 200b, and 200c may be encapsulated by an encapsulation layer 250 for protecting the light-emitting elements.

In the present invention, each of the light-emitting elements 200, 200a, 200b, and 200c may be an inorganic light-emitting diode (LED) or an organic light-emitting diode (OLED).

Next, the red conversion layer 310 converts blue light emitted from the light-emitting elements 200, 200a, 200b, and 200c into red light and includes red light-emitting quantum dots.

In this case, the red light-emitting quantum dot is a semiconductor crystal having a size of several nanometers (nm) and a quantum confinement effect. Light incident into the red light-emitting quantum dot 311 is excited and converted into red light, i.e., light having a main peak in a wavelength area of about 610 nm to about 750 nm.

For example, the red light-emitting quantum dot may be a particle having a single-layered structure or a multi-layered structure including at least one semiconductor crystal selected from the group consisting of CdS, CdO, CdSe, CdTe, $Cd_3P_2$, $Cd_3As_2$, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, Hgl$_2$, AgI, AgBr, Al$_2$O$_3$, Al$_2$S$_3$, Al$_2$Se$_3$, Al$_2$Te$_3$, Ga$_2$O$_3$, Ga$_2$S$_3$, Ga$_2$Se$_3$, Ga$_2$Te$_3$, In$_2$O$_3$, In$_2$S$_3$, In$_2$Se$_3$, In$_2$Te$_3$, SiO$_2$, GeO$_2$, SnO$_2$, SnS, SnSe, SnIe, PbO, PbO$_2$, PbS, PbSe, PbTe, AlN, AlP, AlAs, AlSb, GaN, GaP, GaAs, GaSb, GaInP$_2$, InN, InP, InAs, InSb, In$_2$S$_3$, In$_2$Se$_3$, TiO$_2$, BP, Si, Ge, and combinations thereof.

In order to prevent aggregation of the quantum dots, the red light-emitting quantum dot may include a capping layer on a surface thereof. The capping layer may be a ligand layer coordinate-bonded to the surface of the quantum dot or a surface layer coated with a hydrophobic organic molecule.

For example, the capping layer may be a material layer selected from the group consisting of phosphine oxide, organic amine, an organic acid, a phosphonic acid, which have a long chain alkyl or aryl group, and a combination thereof. For example, the capping layer may be a material layer selected from the group consisting of tri-n-octylphosphine oxide (TOPO), a stearic acid, a palmitic acid, octadecylamine, dodecylamine, a lauric acid, an oleic acid, a hexyl phosphonic acid, and combinations thereof.

In the present invention, the red light-emitting quantum dots may be dispersed in a polymer resin and then cured to manufacture the red conversion layer 310. The present invention is not particularly limited to a material of the polymer resin as long as the quantum dots can be dispersed in the material. For example, a radical-curable resin, a cation-curable resin, or a thermosetting resin may be uses as the polymer resin. More particularly, the polymer resin may include, for example, a polyester acrylate resin, a polyurethane acrylate resin, an epoxy acrylate resin, an epoxy resin, a silicon resin, a polychlorotrifluoroethylene resin, a polyethylene resin, a polypropylene resin, a polyvinyl alcohol resin, a polyester resin, a polystyrene resin, a polymethyl methacrylate resin, and the like. Also, the polymer resin may further include a monomer such as lauryl methacrylate, isobornyl acrylate, and isobornyl methacrylate. In this case, the red conversion layer 310 may be formed in the form of a composite of the quantum dot and the polymer resin.

The red conversion layer 310 may be disposed on an upper or lower portion of the light-emitting element. As shown in FIGS. 1 and 2, the red conversion layer 310 may be disposed directly on an upper portion of the encapsulation layer 250 encapsulating the light-emitting element. Alternatively, as shown in FIGS. 3 and 4, the red conversion layer 310 may be laminated on the upper portion of the light-emitting element after the red conversion layer 310 is disposed on a separate base member 300. When the red conversion layer 310 is disposed on the separate base member 300, the substrate 300 may be laminated so that the surface on which the red conversion layer 310 is disposed faces the light-emitting element as shown in FIG. 3 or vice versa as shown in FIG. 4. Although not shown, an adhesion layer may be disposed between the base member 300 and the encapsulation layer 250.

The present invention is not particularly limited to the base member 300 as long as the base member 300 has a light-transmitting property. For example, the base member 300 may include a glass or polymer substrate.

When the light-emitting elements are bottom-emission type light-emitting elements, the red conversion layer 310 may be disposed on the lower portion of the light-emitting element as shown in FIG. 5. In this case, the red conversion layer 310 may be disposed on a bottom surface of the substrate on which the thin film transistor Tr.

The red conversion layer 310 may be formed by using a pattern forming method well known in the art, for example, inkjet printing, photolithography, or soft lithography.

Next, the green conversion layer 320 converts blue light emitted from the light-emitting element into green light and includes a green phosphor. A green phosphor has high reliability, a narrow full width at half maximum (FWHM), and small afterimage. More specifically, a green phosphor having an FWHM of about 30 nm to about 100 nm may be used as the above-described green phosphor. For example, the green phosphor may include at least one kind of phosphor selected from the group consisting of beta-SiAlON-based phosphor, an LSN-based phosphor, and LuAG-based phosphor.

In the present invention, the green phosphor may be dispersed in a polymer resin and then cured to manufacture the green conversion layer 320. In this case, the present invention is not particularly limited to a material of the polymer resin as long as the phosphor can be dispersed in the material. For example, a radical-curable resin, a cation-curable resin, or a thermosetting resin may be uses as the polymer resin. More particularly, the polymer resin may include, for example, a polyester acrylate resin, a polyurethane acrylate resin, an epoxy acrylate resin, an epoxy resin, a silicon resin, a polychlorotrifluoroethylene resin, a polyethylene resin, a polypropylene resin, a polyvinyl alcohol resin, a polyester resin, a polystyrene resin, a polymethyl methacrylate resin, and the like. In this case, the green conversion layer 320 may be formed in the form of a composite of the phosphor and the polymer resin.

Also, the green conversion layer 320 may be disposed on the upper or lower portion of the light-emitting element. In this case, as shown in FIGS. 1 and 2, the green conversion layer 320 may be disposed directly on the upper portion of the encapsulation layer 250 encapsulating the light-emitting element. Alternatively, as shown in FIGS. 3 and 4, the green conversion layer 320 may be laminated on the upper portion of the light-emitting element after the green conversion layer 320 is disposed on the separate base member 300. When the green conversion layer 320 is disposed on the separate base member 300, the base member 300 may be laminated so that the surface on which the green conversion layer 320 is disposed faces the light-emitting element as shown in FIG. 3 or vice versa as shown in FIG. 4. Although not shown, an adhesion layer may be disposed between the base member 300 and the encapsulation layer 250.

When the light-emitting elements are bottom-emission type light-emitting elements, the green conversion layer 320 may be disposed on the lower portion of the light-emitting element. As shown in FIG. 5, the green conversion layer 320 may be disposed on the bottom surface of the substrate on which the thin film transistor Tr.

The green conversion layer 320 may be formed by using a pattern forming method well known in the art, for example, inkjet printing, photolithography, or soft lithography.

As shown in FIGS. 1 and 3 to 6, the red conversion layer 310 and the green conversion layer 320 may be respectively disposed on the upper or lower portions of the different light-emitting elements. Alternatively, as shown in FIG. 2, the red conversion layer 310 and the green conversion layer 320 may be disposed on the upper or lower portion of one light-emitting element.

More particularly, as shown in FIG. 1, the display device may include a first light-emitting element, a second light-emitting element, and a third light-emitting element, which emit blue light and are arranged in parallel to each other. Then, the red conversion layer may be disposed at a position corresponding to that of the first light-emitting element, and the green conversion layer may be disposed at a position corresponding to that of the second light-emitting element.

Alternatively, as shown in FIG. 2, the display device may be configured so that the red conversion layer and the green conversion layer are disposed on the upper or lower portion of the same light-emitting element. In this case, a first electrode 210 of the light-emitting element 200 includes three electrodes 210a, 210b, and 210c, which are disposed to be spaced apart from each other, to individually drive R, G, and B pixels. Each of the electrodes 210a, 210b, and 210c is connected to a thin film transistor. The red conversion layer 310 is disposed at a position corresponding to one electrode 210a of the three electrodes disposed to be spaced part from each other, the green conversion layer 320 is disposed at a position corresponding to another electrode 210b, and no color conversion layer is disposed at a position corresponding to the rest electrode 210c.

Next, the substrate 100 may be an insulation substrate made of a material such as glass or plastic, and the thin film transistor Tr for driving each of the light-emitting elements may be disposed on a top surface of the substrate 100. Although not shown, the thin film transistor Tr may include a gate electrode disposed on the substrate 100, a gate insulation layer covering the gate electrode, a semiconductor layer overlapping the gate electrode with the gate insulation layer therebetween to form a channel, and source and drain electrodes facing each other with the channel therebetween. Also, a planarization layer 110 is disposed on the thin film transistor Tr. The drain electrode of the thin film transistor Tr disposed on the substrate 100 is connected to the first electrode 210 of each of the light-emitting elements.

If necessary, the display device may further include a barrier film for protecting the red conversion and/or the green conversion layer. FIG. 4 illustrates the display device to which a barrier film 400 is applied according to an embodiment. The barrier film 400 may prevent the red conversion layer 310 from being degraded by moisture, air, and the like. For this, the barrier film 400 may include a single material or composite material having high moisture and/or oxygen barrier properties. For example, the barrier film 400 may include a polymer having high blocking properties with respect to the moisture and/or oxygen, for example, polyethylene, polypropylene, polyvinyl chloride, polyvinyl alcohol, ethylene vinylalcohol, polychlorotriplefluoroethylene, polyvinylidene chloride, nylon, polyamino ether, and cycloolefin-based homopolymers or copolymers.

Although the barrier film 400 is provided as a single layer in the drawings, the present invention is not limited thereto. The barrier film 400 may be provided as a multilayer. For example, the barrier film 400 may have a structure in which a protection layer disposed on the base member is laminated. More particularly, the barrier film 400 may have a structure in which an inorganic film or organic-inorganic hydride film having high barrier properties with respect to the moisture and/or oxygen is applied to the base member. In this case, the inorganic film or organic-inorganic hydride film may be formed by using oxide such as Si, Al, and the like or nitride as a main component. In this case, a polymer film having high light transmittance and heat-resistance may be used as the base member. For example, a polymer film including polyethylene terephthalate (PET), polyethylene naphthalate (PEN), cyclic olefin copolymer (COC), cyclic olefin polymer (COC), and the like may be used as the base member.

The barrier film 400 may have a moisture-permeation rate of about $10^{-1}$ g/m$^2$/day to about $10^{-5}$ g/m$^2$/day under a temperature of about 37.8° C. and relative humidity of about 100% and a moisture-permeation rate of about $10^{-1}$ cc/m$^2$/day/atm to $10^{-2}$ cc/m$^2$/day/atm under a temperature of about 23° C. and relative humidity of about 0%.

Also, the barrier film 400 may have a linear permeation rate of about 88% to about 95% in a visible ray region of about 420 nm to about 680 nm.

Although the barrier film 400 is disposed on the upper portions of the red conversion layer 310 and the green conversion layer 320 in the drawings, the present invention is not limited thereto. For example, when the red conversion layer 310 and the green conversion layer 320 are disposed on the bottom surface of the substrate 100 as shown in FIG. 4, the barrier film 400 may be disposed on the lower portions of the red conversion layer 310 and the green conversion layer 320. Alternatively, the barrier film may be respectively disposed on the upper and lower portions of the red conversion layer 310 and the green conversion layer 320. Alternatively, the barrier film may be disposed on only the upper and/or the lower portion of the red conversion layer 310, and the barrier film may not be disposed on the upper portion and/or the lower portion of the green conversion layer 320.

The display device may further include a color filter if necessary. FIG. 6 illustrates the display device to which color filter 500 is applied according to an embodiment. The color filter 500 may improve color purity. In detail, as shown in FIG. 6, a red filter 510 and a green filter 520 may be disposed at positions corresponding to the red conversion layer 310 and the green conversion layer 320, and a blue filter 530 may be disposed at a position corresponding to a region in which red conversion layer 310 and the green conversion layer 320 are not disposed.

As described above, in the display device, the quantum dots may be used for the red conversion layer, and the phosphor may be used for the green conversion layer. This is done for implementing the display device having superior stability and color reproducibility in the product thereof.

Since the green light-emitting quantum dot is easily degraded by moisture, heat, air, and the like, when the color conversion layer is formed by using the green light-emitting dot, the product may be deteriorated in stability. Thus, the green conversion layer may be formed by using the green phosphor having superior stability so that the product is stably driven. Also, the phosphor having a narrow FWHM may be used as the green phosphor to realize superior color reproducibility.

On the other hand, a red phosphor having a narrow FWHM has not been developed up to now. Thus, in the red conversion layer, the red light-emitting quantum dot may be used to realize the superior color reproducibility. In case of the red light-emitting quantum dot, since the degree of deterioration due to environments is less than that of the green light-emitting quantum dot, the product may be stably driven even though the red light-emitting quantum dot is used. FIG. 7 is a graph showing comparison between degrees of deterioration of the red light-emitting quantum dot and the green light-emitting quantum dot due to external environments. The graph shows results obtained by measuring a time-varying variation in brightness in a state in which films are placed on a blue LED after manufacturing a film formed by using the red light-emitting quantum dot and a film formed by using the green light-emitting quantum dot. As shown in FIG. 7, when the film is formed by using the green light-emitting quantum dot, the brightness rapidly decreases as a time elapses. On the other hand, when the film is formed by using the red light-emitting quantum dot, the change in brightness is not great.

Also, since only one blue light-emitting element is used as the light-emitting element in the present invention the light-emitting elements respectively provided in the sub-pixels have the same size, and the light-emitting elements may be manufactured through one process to thereby simplify the manufacturing process.

Also, since the light emitted from the light-emitting element without being converted to blue light is directly used to obtain the red light and the green light from the blue light, the light utilization efficiency may be relatively high when compared that the blue light, the red light, and the green light are obtained through the color conversion of the white light.

The invention claimed is:

1. A display device comprising:
    first to third blue light-emitting elements spaced apart from each other and including blue light-emitting material;
    an encapsulation layer surrounding each of the first to third light-emitting elements;
    a red conversion layer disposed on a first portion of the encapsulation layer corresponding to the first blue light-emitting element and comprising a red light-emitting quantum dot;
    a green conversion layer disposed on a second portion of the encapsulation layer corresponding to the second blue light-emitting element and comprising a green light-emitting phosphor; and
    a substrate comprising first to third thin film transistors electrically connected to the first to third blue light-emitting elements, respectively,
    wherein the green light-emitting phosphor has a FWHM of 30 nm to 100 nm and includes at least one kind of phosphor selected from the group of consisting of beta-SiAlON-based phosphor, LSN-based phosphor, and LUAG-based phosphor.

2. The display device of claim 1, wherein the first to third light-emitting elements comprise an inorganic light-emitting diode or an organic light-emitting diode.

3. The display device of claim 1, wherein the first to third light-emitting elements comprise a first electrode, an emission layer on the first electrode, and a second electrode on the emission layer.

4. The display device of claim 3, further comprising at least one functional layer for improving hole injection and transport capability between the first electrode and the emission layer.

5. The display device of claim 3, further comprising at least one functional layer for improving electron injection and transport capability between the second electrode and the emission layer.

6. The display device of claim 1, wherein the red conversion layer is made of a composite of the red light-emitting quantum dot and a polymer.

7. The display device of claim 1, wherein the green conversion layer is made of a composite of the green light-emitting phosphor and a polymer.

8. The display device of claim 1, further comprising:
    a base member disposed on the first and second portions of the encapsulation layer.

9. The display device of claim 8, further comprising a barrier film on the red conversion layer and the green conversion layer,
    wherein the base member is disposed between the encapsulation layer and the red and blue conversion layers.

10. The display device of claim 9, wherein the barrier film has a moisture-permeation rate of about $10^{-1}$ g/m$^2$/day to about $10^{-5}$ g/m$^2$/day under a temperature of about 37.8° C. and relative humidity of about 100% and a moisture-permeation rate of about $10^{-1}$ cc/m$^2$/day/atm to $10^{-2}$ cc/m$^2$/day/atm under a temperature of about 23° C. and relative humidity of about 0%.

11. The display device of claim 3, wherein the first electrode of the respective first to third light-emitting elements comprises three electrodes spaced apart from each other.

12. The display device of claim 11, wherein the red conversion layer is disposed at a position corresponding to one electrode of the three electrodes, and
    the green conversion layer is disposed at a position corresponding to another electrode.

13. The display device of claim 1, further comprising a color filter on the red conversion layer and the blue conversion layer and including a red filter and a green filter, the red filter corresponding to the red conversion layer and the green filter corresponding to the greed conversion layer.

14. A display device comprising:
    first to third blue light-emitting elements spaced apart from each other and including blue light-emitting material;
    an encapsulation layer surrounding each of the first to third light-emitting elements;
    a substrate comprising first to third thin film transistors electrically connected to the first to third blue light-emitting elements, respectively;
    a red conversion layer disposed under a first portion of the substrate corresponding to the first blue light-emitting element and comprising a red light-emitting quantum dot; and
    a green conversion layer disposed under a second portion of the substrate corresponding to the second blue light-emitting element and comprising a green light-emitting phosphor,
    wherein the green light-emitting phosphor has a FWHM of 30 nm to 100 nm and includes at least one kind of phosphor selected from the group of consisting of beta-SiAlON-based phosphor, LSN-based phosphor, and LUAG-based phosphor.

15. A display device comprising;
    a red sub-pixel comprising a first blue light-emitting element, and a red conversion layer corresponding to the first blue light-emitting element;
    a green sub-pixel comprising a second blue light-emitting element, and a green conversion layer corresponding to the second blue light-emitting element;
    a blue sub-pixel comprising a third blue light-emitting element; and
    an encapsulation layer surrounding each of the first to third light-emitting elements,
    wherein the first to third blue light-emitting elements are spaced apart from each other and include a blue light-emitting material,
    wherein the first to third light-emitting elements emit blue light,
    wherein the red conversion layer is disposed on a first portion of the encapsulation layer corresponding to the first blue light-emitting element, and comprises a red light-emitting quantum dot,
    wherein the green conversion layer is disposed on a second portion of the encapsulation layer corresponding to the second blue light-emitting element, and comprises a green light-emitting phosphor,
    wherein the green light-emitting phosphor has a FWHM of 30 nm to 100 nm and includes at least one kind of phosphor selected from the group of consisting of beta-SiAlON-based phosphor, LSN-based phosphor, and LUAG-based phosphor, and wherein the blue sub-pixel comprises no conversion layer on a third portion of the encapsulation layer corresponding to the third blue light-emitting element.

16. The display device of claim 15, further comprising:

a color filter on the red conversion layer and the blue conversion layer and including a red filter and a green filter, the red filter corresponding to the red conversion layer and the green filter corresponding to the green conversion layer.

17. The display device of claim 15, further comprising:

a barrier film on the red conversion layer and the green conversion layer.

* * * * *